United States Patent [19]

Fasching

[11] Patent Number: 4,680,585

[45] Date of Patent: Jul. 14, 1987

[54] PULSE-EXCITED, AUTO-ZEROING MULTIPLE CHANNEL DATA TRANSMISSION SYSTEM

[75] Inventor: George E. Fasching, Morgantown, W. Va.

[73] Assignee: The United States of America as represented by the United States Department of Energy, Washington, D.C.

[21] Appl. No.: 704,114

[22] Filed: Feb. 22, 1985

[51] Int. Cl.[4] .............................................. G01C 15/08
[52] U.S. Cl. ........................... 340/870.13; 340/870.19
[58] Field of Search .............. 340/870.13, 858, 870.14, 340/870.19, 870.04, 870.11

[56] References Cited

U.S. PATENT DOCUMENTS 3,357,007 12/1967 Wike et al. ................. 340/870.13 X
3,909,811 9/1975 Adler .............................. 340/870.13

*Primary Examiner*—Jerry W. Myracle
*Attorney, Agent, or Firm*—Richard E. Constant

[57] ABSTRACT

A multiple channel data transmission system is provided in which signals from a plurality of pulse operated transducers and a corresponding plurality of pulse operated signal processor channels are multiplexed for single channel FM transmission to a receiving station. The transducers and corresponding channel amplifiers are powered by pulsing the dc battery power to these devices to conserve energy and battery size for long-term data transmission from remote or inaccessible locations. Auto zeroing of the signal channel amplifiers to compensate for drift associated with temperature changes, battery decay, component aging, etc., in each channel is accomplished by means of a unique auto zero feature which between signal pulses holds a zero correction voltage on an integrating capacitor coupled to the corresponding channel amplifier output. Pseudo-continuous outputs for each channel are achieved by pulsed sample-and-hold circuits which are updated at the pulsed operation rate. The sample-and-hold outputs are multiplexed into an FM/FM transmitter for transmission to an FM receiver station for demultiplexing and storage in separate channel recorders.

3 Claims, 5 Drawing Figures

PULSE-EXCITED, AUTO-ZEROING MULTIPLE CHANNEL DATA TRANSMISSION SYSTEM

BACKGROUND OF THE INVENTION

The present invention relates generally to telemetry systems and more specifically to a pulsed telemetry system for conserving operating power.

In many telemetry systems for transmitting multiple channels of data derived from various types of transducers it is necessary to use battery power due to remote or inaccessible locations of the transducers. Often the battery size requirements for extended operation of the system becomes prohibitively large thus dictating intermittent operation to conserve energy and reduce battery size. However, in many systems, particularly in FM transmission systems, it is desirable to maintain continuous transmission to maintain synchronous operation for proper data channel recognition and readout.

One particular system in which the above problems are encountered is in an FM telemetry system for transmitting data from a plurality of strain gauges mounted on the bed stirrer for a coal gasifier. The stirrer is driven by a shaft which extends down from the top of the gasifier housing and is driven to obtain both rotating and reciprocating motions, thereby requiring wireless data transmission therefrom. The strain gauge instrumentation is required to measure three types of stirrer shaft loading: torque, bending (requires 2 sets of gauges) and axial. Four strain gauge bridges are mounted on the stirrer shaft in a conventional manner to obtain these measurements. The strain gauge electronics, batteries, and an FM telemetry link including a multiplexer, modulator and transmitter are all mounted on the stirrer shaft.

The energy required for continuous strain gauge bridge excitation for continuous operation of the gasifier over extended periods of time would required batteries which are too large to be supported by the stirrer shaft. Further, due to temperature changes, battery decay and component aging the electronic system is subject to zero drift associated with these factors. Thus, it will be seen that there is a need for a pulse-excited, auto-zeroing multiple channel data transmission system for use in wireless data transmission systems.

SUMMARY OF THE INVENTION

In view of the above needs it is an object of this invention to provide a pulse-excited, auto-zeroing multiple channel data transmission system.

Further, it is an object of this invention to provide a multiple channel data transmission system as in the above object which further provides pseudo-continuous outputs from each channel for augmenting FM transmission.

Other objects and many of the attendant advantages of the present invention will be obvious from the following detailed description taken in conjunction with the drawings.

In summary, the present invention is a pulse-excited, auto-zeroing multiple channel data transmission system in which signals from a plurality of pulse-excited transducers and associated channel amplifiers are converted into pseudo-continuous outputs that are multiplexed into a transmitter for transmission to a receiving station. Means are provided to compensate for amplifier zero drift by an auto-zeroing circuit which is activated prior to excitation of the transducers. An integrating capacitor in each channel is charged to a value which corresponds to the zero-offset voltage of the amplifier output with no signal input. During pulse excitation this voltage is used to control the voltage offset inputs to the amplifier to provide an output signal which has the proper zero reference.

DETAILED DESCRIPTION

Figure 1:
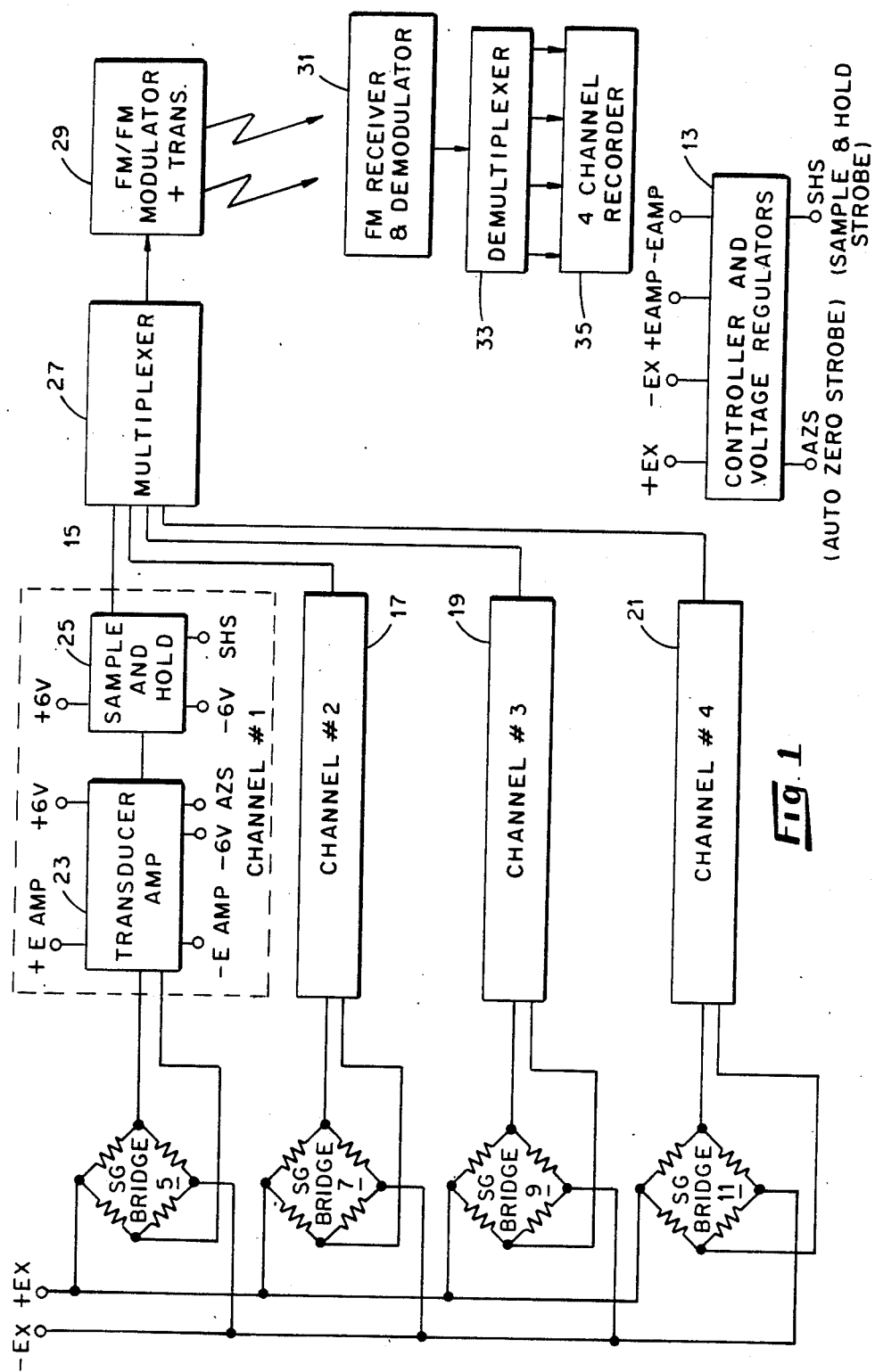
FIG. 1 is a schematic block diagram of a pulse-excited, auto-zeroing multiple channel data transmission system for transmitting data from a plurality of strain gauge bridges in accordance with the present invention.

Referring now to FIG. 1, the multiple channel data transmission system will be described for use in transmitting signals from four strain gauge bridges (5–11) used to measure loading on the stirrer shaft of a coal gasifier as discussed above. It will be understood that the system could be used for various other types of transducers. The input of the bridges are connected to pulsed outputs (−EX and +EX) of a controller and voltage regulator circuit 13. The outputs of the bridges (5–11) are connected to corresponding channel signal processing circuits 15–21. Each channel processing circuit is identical in structure to that depicted for channel 1 shown enclosed by dashed lines 15. Each channel includes a pulse-excited, transducer amplifier 23 which receives the corresponding channel bridge output. The amplifier 23 is energized by pulsed outputs −E and +E, continous excitation inputs −6 V and +6 V and an auto zero strobe pulse (AZS) from the controller 13. The output of the transducer amplifier circuit 23 is connected to the input of a sample-and-hold circuit 25 which has continuous inputs (+6 V and −6 V) and a sample-and-hold strobe (SHS) input supplied by the controller 13. The outputs of the sample-and-hold circuits are connected to separate inputs of a conventional multiplexer 27 whose output is connected to an FM/FM modulator and transmitter 29. The transmitter is referred to as an FM/FM transmitter in that the multiplexer output is used to frequency modulate a subcarrier which, in turn, frequency modulates the carrier signal to improve transmission stability.

The FM carrier signal is transmitted to an FM receiver and demodulator 31 whose output is connected to a demultiplexer 33. The signal is demultiplexed and separate channel values are recorded in a four-channel recording device 35.

Figure 2:
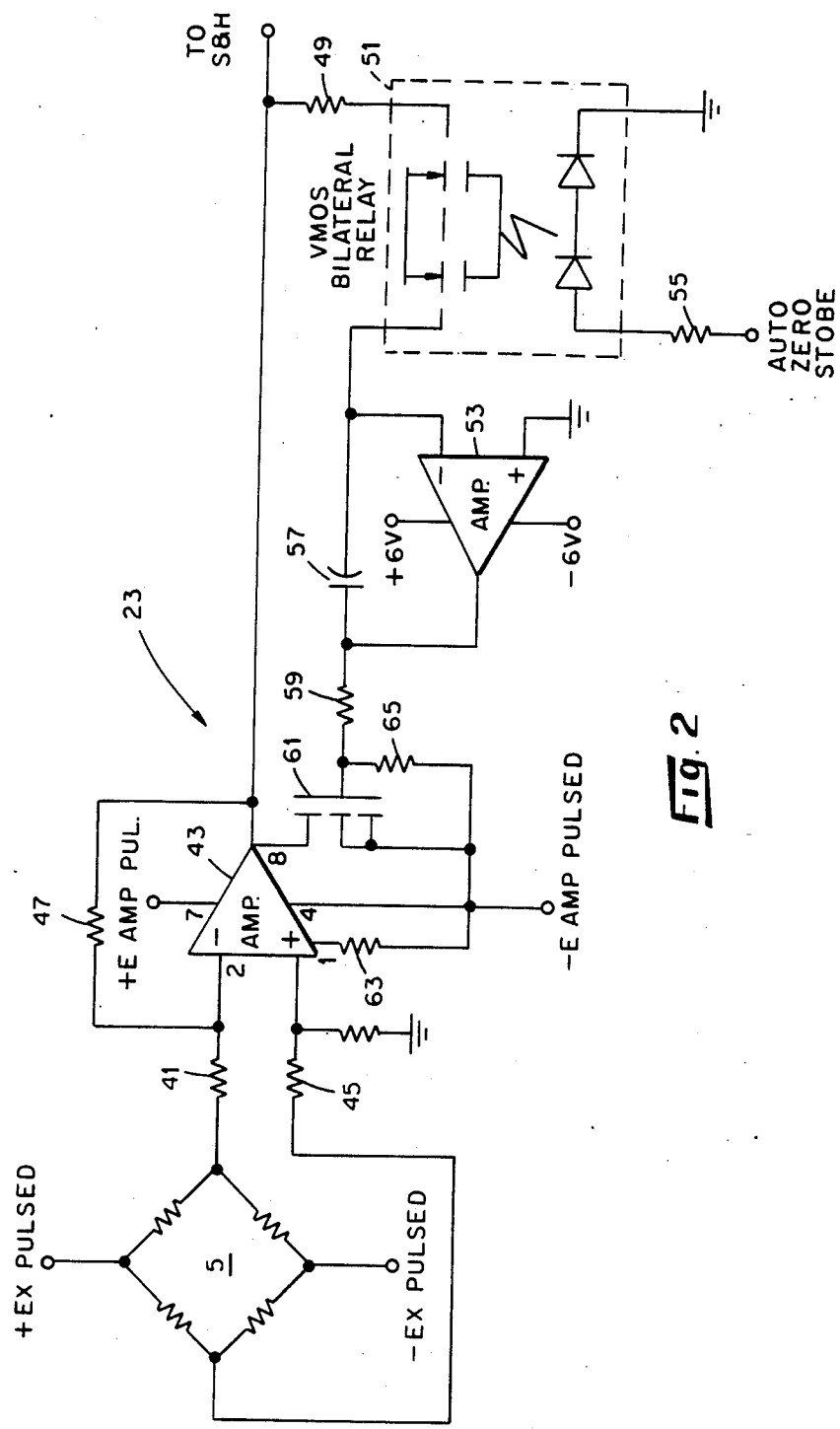
FIG. 2 is a schematic diagram of the transducer amplifier shown in block form in FIG. 1.

Referring now to FIG. 2, there is shown a detailed circuit diagram of the transducer amplifier circuit 23 together with the corresponding bridge circuit 5. One output of the bridge 5 is connected through a resistor 41 to the inverting input of an operational amplifier 43 and the other output is connected through a resistor 45 to the noninverting input of amplifier 43. Amplifier 43 is a commercially available operational amplifier, such as the Model 504 supplied by Burr-Brown, Tucson, Ariz., which has separate inputs 1 and 8 for the application of positive and negative offset voltages, respectively, to null the amplifier output, i.e., zeroing the output of the amplifier. Terminals 4 and 7 are power supply inputs for −E AMP (−8 V) and +E AMP (+8 V), respectively. The output of amplifier 43 is fed back to the inverting input through a resistor 47 which operates in conjunction with resistor 41 to control the gain, typically set at 1,000. Further, the output of amplifier 43 is connected to the input of the sample-and-hold circuit 25.

In order to zero the amplifier 43 prior to reading the output of the bridge 5 a special feedback circuit, which is operated by the auto zero strobe, is connected between the output of the amplifier and the offset null inputs 1 and 8. The output of amplifier 43 is connected through a resistor 49 and a VMOS bilateral relay 51 to the inverting input of a CMOS operational amplifier 53 which has the noninverting input thereof connected to ground potential. The activating input to the relay 51 is connected to receive the auto zero strobe pulse from the controller 13 through a current limiting resistor 55. A storage capacitor 57 is connected between the output of amplifier 53 and the inverting input thereof. The output of amplifier 53 is connected through a resistor 59 to the gate of a VMOS transistor 61 which has its drain electrode connected to the negative offset null terminal 8 of amplifier 43. The source electrode of transistor 61 is connected to the −E AMP input of amplifier 43 and through a resistor 63 to the positive offset null terminal 1 of amplifier 43. Further, the gate of transistor 61 is connected through resistor 65 to the source electrode thereof.

Figure 5:
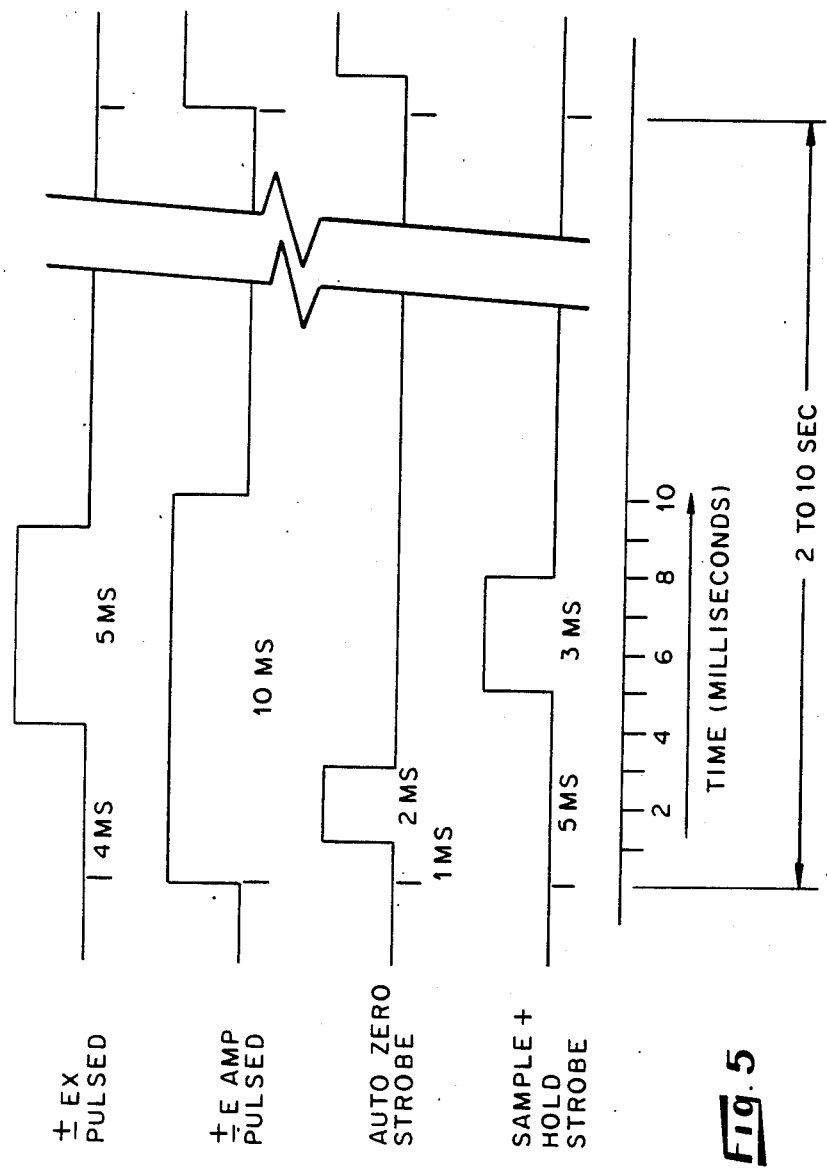
FIG. 5 is a timing diagram for the excitation and control outputs of the controller and voltage regulator of FIG. 4.

Prior to each pulsed excitation of the bridge 5, the amplifier 43 is excited just prior to the generation of the auto zero strobe pulse, as shown in the timing diagram of FIG. 5. The 2 millisecond auto zero strobe pulse activates relay 51 thereby connecting the output of amplifier 43 to one side of the storage capacitor 57. Capacitor 57 is charged in a direction and an amount that drives the output of amplifier 43 toward zero volts due to the action of the amplifier 53. Transistor 61 behaves like a controlled variable resistor connected to the negative offset input 8 of amplifier 43, thereby supplying an offset voltage to compnesate the output of the amplifier. The resistor 63 connected to the positive offset input provides an offset imbalance for the transistor 61 to operate against. Thus, the conduction level of transistor 61 is controlled by the charge developed on capacitor 57 and this level is held during the period that the bridge is strobed on and the sample-and-hold circuit 25 is activated to update the channel output and eliminates dc offset error from the output signal.

Figure 3:
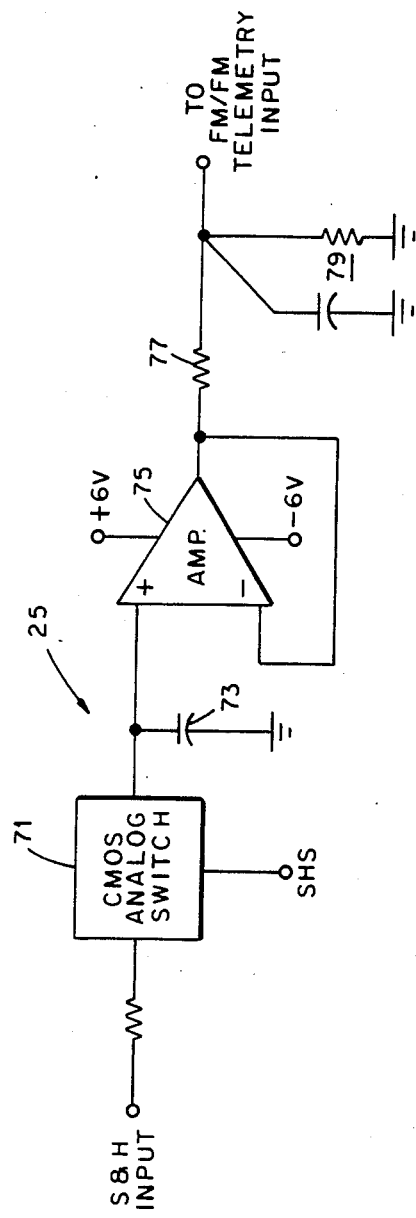
FIG. 3 is a schematic diagram of the sample-and-hold circuit shown in block form in FIG. 1.

Turning now to FIG. 3, it will be seen that the sample-and-hold circuit 25 includes a CMOS analog switch is connected between the output of the transducer amplifier circuit 23 and one terminal of a storage capacitor 73. The switch 71 is activated for three milliseconds during the period that the bridge 5 is excited by applying the SHS (sample hold strobe) output from controller 13 to the switching control input thereof. The other terminal of capacitor 73 is connected to ground and is further connected to apply the stored charge voltage to an amplifier 75. The voltage drop at the output of amplifier 75 is less than ±1 millivolt between samples that are typically about three seconds apart. The sampling period, or the sample-and-hold update rate, may be varied between two and ten second, as indicated in the timing diagram of FIG. 5. This low drop is accomplished using a field effect transistor input (CMOS) amplifier for amplifier 75.

The amplifier 75 output which attains up to 1.6 volts level full scale is attenuated to 100 μm volts, or less as required for the FM/FM telemetry input, by a series resistor 77 connected between the output of amplifier 75 and the corresponding channel input to the multiplexer 27 (FIG. 1). Further, the output is filtered by means of a filter circuit 79 connected between the output and ground potential. This circuit filters out transient noise spikes that occur during the strobing of the switch 71.

Figure 4:
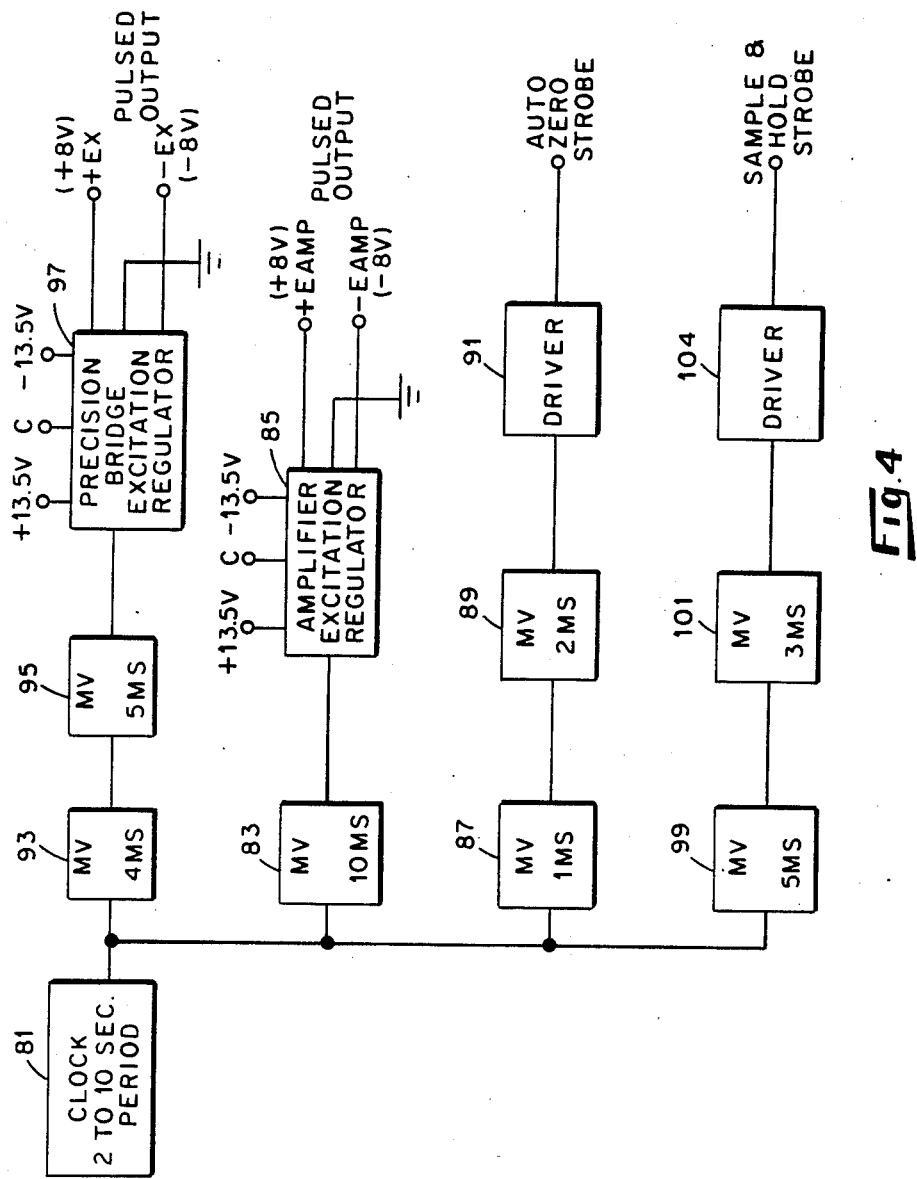
FIG. 4 is a block diagram of the controller and voltage regulator shown in block form in FIG. 1.

As pointed out above, timing for the various excitation pulses and strobe pulses is provided by the controller 13 which is shown in detail in FIG. 4. Timing for the pulses is derived from a clock pulse generator 81 which can be set to produce pulses at rates varying between two and ten seconds. As shown in FIG. 5, each clock pulse first produces the 10 msec amplifier excitation pulse by connecting the output to a one-shot multivibrator (MV) 83 which activates an amplifier excitation regulator 85 to output the +E AMP and −E AMP signals which are regulated outputs as +8 V and −8 V, respectively, derived from +13.5 and −13.5 V battery inputs. The auto zero strobe signal is produced by connecting the clock 81 output to a one msec MV 87 which delays the generation of the pulse for one msec until MV 87 times out. This triggers a two msec MV 89 to generate the auto zero strobe pulse which is amplified by a driver circuit 91. The bridge excitation pulses are generated by applying the clock pulse to a four msec MV 93 which triggers a five msec MV 95 when it times out. The MV 95 output activates a precision regulator 97 to produce the −8 V and +8 V regulated outputs for a five msec period in which the bridge is excited. The sample-and-hold strobe signal is generated by applying the clock output to a five msec MV 99 which triggers a three msec MV 101 when it times out. This three msec pulse is amplified by a driver circuit 103 and applied to the analog switch 71 in the sample-and-hold circuit 25 to sample the bridge 5 signal to update the charge stored by the charge storage capacitor 73 in the sample-and-hold circuit 25. Thus, it will be seen that in each of the channels the sample-and-hold circuit is updated at the selected clock rate (2–10 pulses/sec.) and these pseudo-continuous outputs are scanned by the multiplexer 27 at an unrelated scanning rate for wireless transmission to the receiver 31.

It will be seen that by using pulse excitation not only battery power consumption is reduced, but gauge self-heating is also reduced to improve measurement accuracy. Thus, higher bridge voltages or other transducer excitation voltages, may be used which yields significantly higher output signals. This is very advantageous in applications where the levels being sensed by the transducers are very low. In the system as described above, each transducer requires about 35 milliamps. By using a three second clock rate, battery energy and subsequently size was reduced by a factor of approximately 500 allowing batteries of practical size and weight to be used.

Further, accuracy in measurement is improved by the auto zero technique. This reduces the transducer amplifier offset drift to less than ±0.5 microinch/inch strain which equals less than ±0.5 percent of full scale. Otherwise drifts could be greater than ±3.0 percent of full scale.

Thus, it will be seen that a multiple channel data transmission system has been provided in which signals from a plurality of pulse operated transducer channels are multiplexed for single channel FM transmission to a receiving station. Auto zeroing of the transducer amplifier in each of the channels is provided to reduce measurement errors.

Although the invention has been illustrated by way of a specific example, it will be understood that various modifications and changes may be made therein without departing from the spirit and scope of the invention as set forth in the following claims.

I claim:

1. A multiple channel data transmission system, comprising:

a plurality of data channels, each channel including a transducer for generating an output signal proportional to a variable to be measured in response to the application of a transducer excitation pulse thereto, a transducer amplifier means for amplifying the output of said transducer in response to the application of an amplifier excitation pulse, a sample-and-hold circuit means for sampling and holding the output level of said amplifier means in response to a sample-and-hold strobe pulse applied thereto and an auto zeroing means for nulling the output of said amplifier means in response to an auto zero strobe pulse applied thereto;

a control means for cyclically generating at a selected cycle rate said transducer excitation pulse, said amplifier excitation pulse, said sample-and-hold strobe pulse and said auto zero strobe pulse so that said amplifier means is excited for a preselected period during which said auto zero strobe pulse is generated followed by said transducer excitation pulse and said sample-and-hold strobe pulse is generated during said transducer excitation pulse so that the value stored by said sample-and-hold circuit means is updated during each cycle of said control means, thereby producing pseudo-continuous outputs from said sample-and-hold circuit means of each of said plurality of data channels;

a transmitter means including a multiplexer means for continuously sampling said pseudo-continuous outputs of each of said data channels and multiplexing said signals onto a a single channel to produce a modulated signal to be transmitted; and a receiver means for receiving said modulated signal.

2. The system as set forth in claim 1 wherein said transducer amplifier means includes an operational amplifier having an output offset nulling input and wherein said auto zeroing means includes an integrating capacitor means for storing a charge proportional to the zero offset of the output of said operational amplifier when connected to the output of said operational amplifier, a relay means operative in response to said auto zero strobe pulse for connecting said integrating capacitor means to the output of said operational amplifier, and a voltage generating means for generating and applying a nulling voltage level to said offset nulling input of said operational amplifier in response to the charge stored by said integrating capacitor means to continually compensate for zero offset of the output of said operational amplifier.

3. The system as set forth in claim 2 wherein said sample-and-hold circuit means includes an analog switch connected to the output of said operational amplifier and having an activating input connected to receive said sample-and-hold strobe pulse, a charge storage capacitor connected to the output of said switch, and an output circuit means for generating an output signal proportional to the charge stored on said charge storage capacitor.

* * * * *